STEPWISE ADJUSTABLE PHASE CONTROLLED OSCILLATOR LOOP

Filed Jan. 30, 1968 2 Sheets-Sheet 1

INVENTORS
MARINUS A. BOS
JOHANNES NOORDANUS
GERARDUS ROSIER
BY
Frank R. Trifari
AGENT MARINUS A. BOS
JOHANNES NOORDANUS
GERARDUS ROSIER INVENTORS
BY
Frank R. Trifari
AGENT United States Patent Office 3,516,007
Patented June 2, 1970

3,516,007
STEPWISE ADJUSTABLE PHASE CONTROLLED OSCILLATOR LOOP

Marinus Anton Bos, Johannes Noordanus, and Gerardus Rosier, Hilversum, Netherlands, assignors, by mesne assignments, to U.S. Philips Corporation, New York, N.Y., a corporation of Delaware Filed Jan. 30, 1968, Ser. No. 701,773
Claims priority, application Netherlands, Feb. 11, 1967, 6702110
Int. Cl. H03b 3/04
U.S. Cl. 331—18 6 Claims

ABSTRACT OF THE DISCLOSURE

A phase controlled oscillator loop including a frequency divider, and a preprogrammed pulse generator responsive to the output of said divider for periodically producing a pulse for effectively adding or subtracting pulses from the input to the divider, thereby altering the divider ratio.

The invention relates to a device employing a stepwise adjustable oscillator. The oscillator is included in an AFC-circuit provided with an adjustable digital frequency divider which is connected to the output of the adjustable oscillator and which supplies a number of pulses corresponding to the divided oscillator frequency. A phase discriminator is provided, to which the output of the adjustable digital frequency divider and a reference frequency are connected for producing an AFC-control voltage which is supplied for AFC-control, through a low-pass filter, to a frequency corrector coupled to the adjustable oscillator.

Such adjustable oscillators are advantageously used in practice for producing an oscillator frequency of crystal stability which is adjustable in fine steps within a wide frequency range. In a practical embodiment, for example, an oscillator is obtained which is adjustable in steps of 0.1 mc./s. in the frequency range of 20–70 mc./s. by using a digital frequency divider having a ratio of division which is adjustable between 200–700 and a crystal oscillator of 0.1 mc./s. as a reference frequency source. It has been found that in increasing the number of frequency steps, which is effected by simultaneously increasing the ratio of division of the digital frequency divider and decreasing the reference frequency, difficulties are encountered in the construction and the proportioning of the AFC-loop. Inter alia, the limit frequency of the low-pass filter should be reduced when the reference frequency is reduced so that this filter becomes heavy and bulky, and in addition the control time for stabilization of the oscillator frequency is increased, a disadvantage and not permissible for many applications.

It is the object of the invention to provide a different conception of the device of the type mentioned in the preamble to increase the number of frequency steps in which the above restrictions are avoided while in addition a larger freedom in design is obtained.

The device according to the invention is characterized in that the digital frequency divider comprises a program pulse generator which is controlled by the output pulses of the digital frequency divider. The generator supplies pulses according to the adjusted program and, in addition, the program pulse generator is connected as a control circuit to the adjustable digital frequency divider which is varied in its ratio of division each time an output pulse of the program pulse generator occurs.

The invention and its advantages will now be described with reference to the figures.

FIG. 1 shows an adjustable oscillator according to the invention, while

FIG. 1 shows a device employing a stepwise adjustable oscillator 1 included in an AFC-circuit. The device shown is constructed, for example, for producing a frequency which is adjustable in the frequency range of 20–70 mc./s. in steps of 0.1 mc./s.

Figure 1:
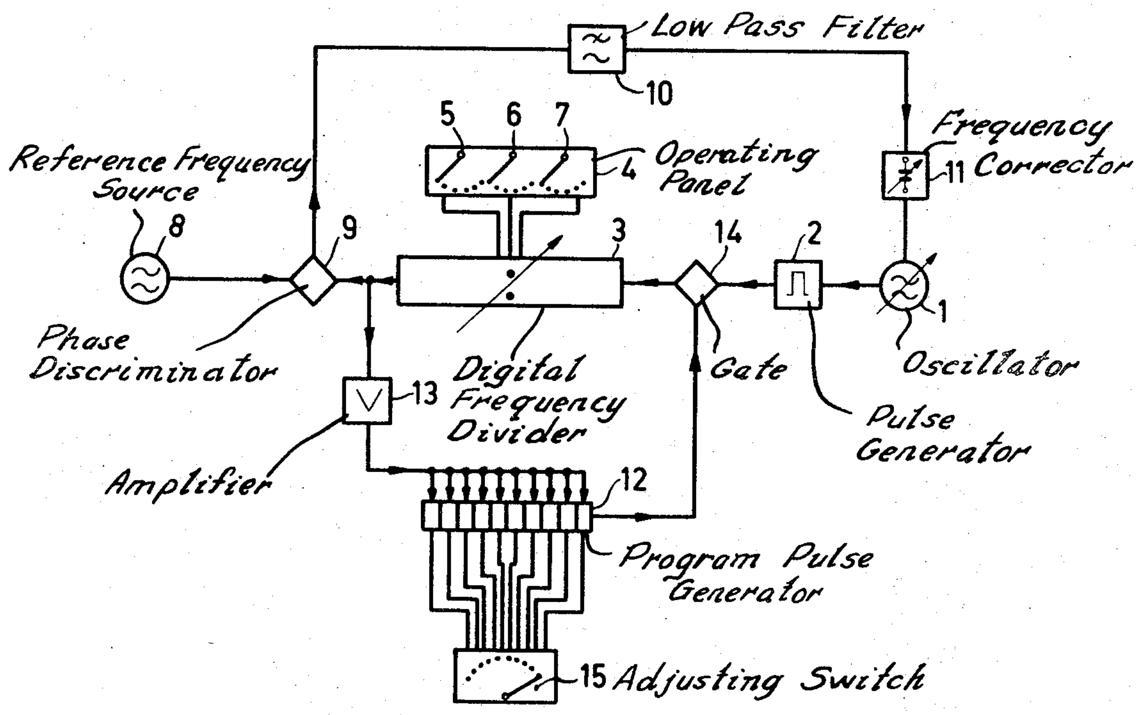

In this device the adjustable oscillator 1 is connected to a pulse generator 2 to generate a series of pulses with a pulse frequency equal to the oscillator frequency and the pulse generator 2 is succeeded by an adjustable digital frequency divider 3, the ratio of division of which can be adjusted between 200–700 by means of an operating panel 4 having switches 5, 6, 7 which in this sequence serve to adjust the hundreds, tens and units of the ratio of division. Such adjustable frequency dividers are shown in U.S. Pats. 3,384,827 and 3,456,200 filed Oct. 23, 1964, and Feb. 9, 1966, respectively, and therefore need not be described in detail in the present patent application.

In the device shown the frequency of the oscillator 1 is stabilized by a control frequency originating from a reference frequency source 8 which is constituted by a crystal oscillator having a frequency of 0.1 mc./s. For this purpose the output of the digital frequency divider 3 together with the output of the source 8 is applied to a phase discriminator 9 to generate an AFC-control voltage which is applied, through a low-pass filter 10 suppressing the frequency of the output of the digital frequency divider 3 and the signal from source 8, to a frequency corrector 11 coupled to the adjustable oscillator 1.

The frequency corrector 11 is controlled in accordance with the AFC-1 control voltage in such manner that there exists accurate frequency equality between the oscillator frequency divided in the digital frequency divider 3 and the frequency of the reference frequency source 8; however, between these oscillations a phase shift remains the value and polarity of which depend upon the value and sign of the caused frequency correction. In the case of stabilization the control voltage, obtained by smoothing in the low-pass filter 10 the output voltage of the phase discriminator 9, substantially is a direct voltage, very high requirements being imposed upon the suppression of undesired frequencies occurring in the reference frequency, since these undesired frequencies cause a phase modulation of the oscillator frequency through the frequency corrector 11. In the embodiment described, for example, a suppression of the reference frequency of 0.1 mc./s. by 80 db is desired which corresponds to a limit frequency of the low-pass filter 10 of approximately 11 kc./s.

The device described enables a particularly simple and clear adjustment of the oscillator frequency, if, for example, it is desirable to adjust the frequency of the oscillator at 47.5 mc./s. the ratio of division of the digital frequency divider is set at 475 by adjusting the operating switches 5, 6, 7 in said sequence at the values 4, 7, and 5, after which the oscillator 1 is automatically set to the desired frequency of 47.5 mc./s. by the AFC control in the AFC-circuit. Actually, as already described above, the frequency of the output pulses of the digital frequency divider 3 is accurately made equal to the frequency of 0.1 mc./s. of the reference frequency source 8 by the AFC-control so that thus the frequency of the oscillator 1 is equal to $475 \times 0.1$ mc./s.$=47.5$ mc./s.

Figure 2:
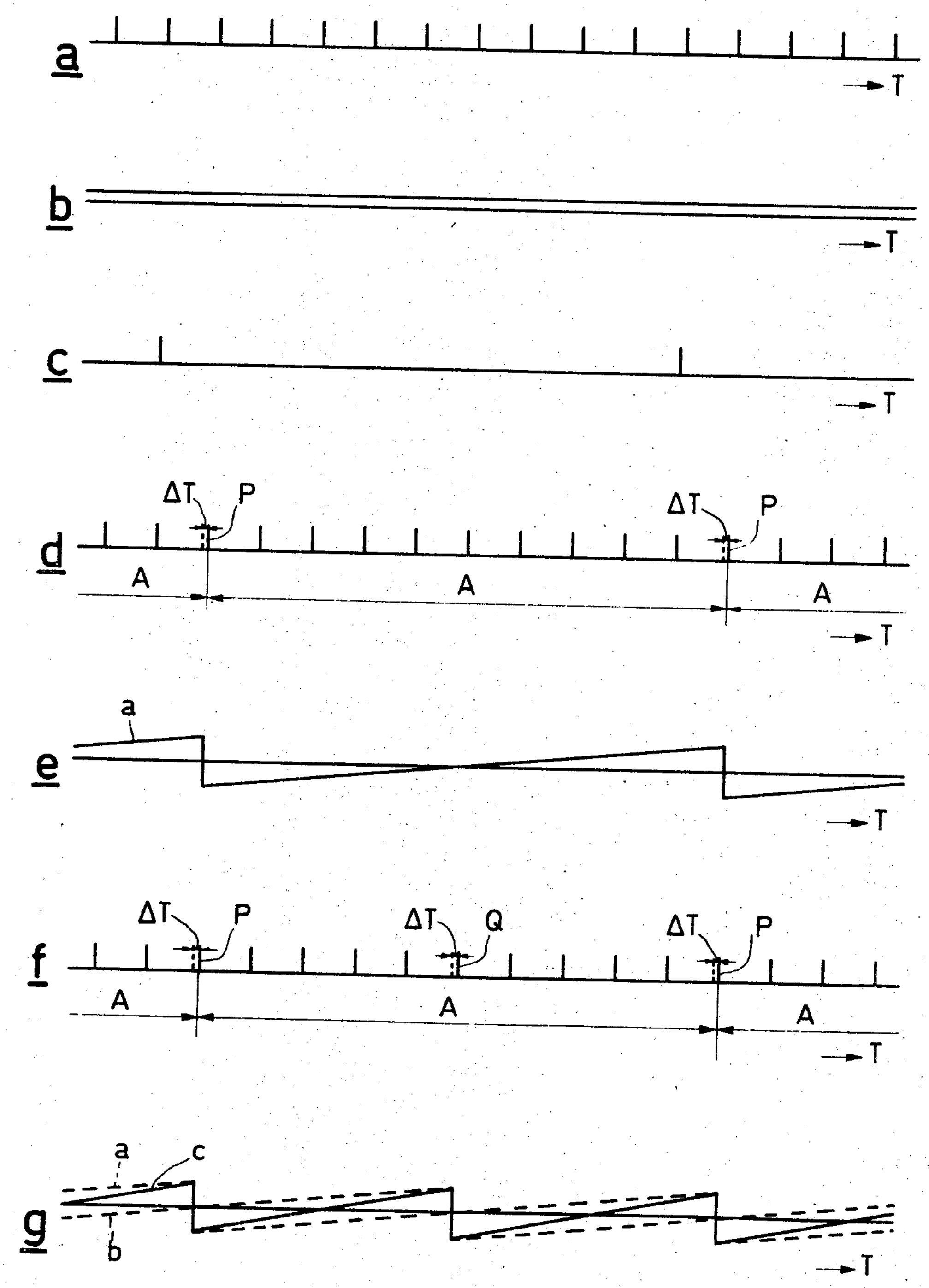
FIG. 2 shows a few time diagrams to explain the device according to the invention.

For explaining the operation of the device described thus far, FIGS. 2*a* and 2*b* show a few time diagrams. In particular FIG. 2*a* shows the output pulses of the digital frequency divider 3, which output pulses appear each time after a number of input pulses corresponding to the adjusted ratio of division of the digital frequency divider 3 and in the embodiment described, in which the ratio of division is set at 475, the digital frequency divider 3 supplies an output pulse, for example, each time after 475 input pulses and thus the pulse frequency of the output pulses of the digital frequency divider 3 is equal to the 475th part of the pulse frequency of the input pulses.

For completeness' sake, FIG. 2*b* shows the variation of the AFC-control voltage derived from the lowpass filter 10 in the case of stabilization of the oscillator frequency which voltage, as already stated above, is formed by a direct voltage.

If it should be desirable with the device described thus far to increase the number of frequency steps it is necessary to decrease the frequency of the reference frequency source 8 simultaneously with an increase of the ratio of division of the digital frequency divider 3; if it is desirable, for example, to increase the number of frequency steps by a factor 10, corresponding to a decrease of a a frequency step of 0.1 mc./s. to 0.01 mc./s., the ratio of division should simultaneously be brought from 200–700 to 2000–7000 and the frequency of the control reference frequency 8 from 0.1 mc./s.–0.01 mc./s. The frequency adjustment is effected quite analogous to that described above. Actually, if a frequency adjustment of 47.51 mc./s. is desired, the digital frequency divider 3 is adjusted to the ratio of division 4751 after which the oscillator 1 will automatically adjust by the AFC control to the frequency $4751 \times 0.01$ mc./s.=47.51 mc./s.

In this manner it is made possible in the known device to increase the number of frequency steps; however, it is found that technical difficulties present themselves in the construction and proportioning of the AFC-circuit as a result of the increase of the number of frequency steps. In particular in decreasing the frequency of the reference frequency source 8, the limit frequency of the low-pass filter 10, in order to meet the suppression requirement of said frequency in the AFC-control voltage, must also be reduced considerably, as a result of which the low-pass filter 10 becomes heavy and bulky, while in addition as a result of said decrease in the limit frequency the time for reaching stabilisation of the oscillator 1 after adjusting the ratio of division (adjusting period) is increased which is not admissible for many applications. For example, in the embodiment described in which the value of a frequency step is 0.01 mc./s. the limit frequency of the low-pass filter is approximately 1.1 kc./s. and the adjusting period 0.45 msec. All elements and the properties of said known device are fully fixed by the value of the frequency steps to be used.

To avoid these restrictions in the known device, when increasing the number of frequency steps, the invention provides another solution which consists in that the digital frequency divider 3 comprises a program pulse generator 12 controlled by the output pulses of the digital frequency divider 3, which generator supplies output pulses according to the adjusted program and further that the program pulse generator 12 is connected to the adjustable digital frequency divider 3 as a control circuit which is varied in its ratio of division each time an output pulse of the program pulse generator 12 appears. In the embodiment shown the program pulse generator 12 connected to the digital frequency divider 3 as a control circuit is constituted by a shift register having, for example, ten shift register elements, the content of the shift register 12 being shifted, through an amplifier 13, by the output pulses of the digital frequency divider 3, the output pulses of the shift register 12 being applied, to vary the ratio of division of the digital frequency divider 3, as gating pulses to a gate 14 connected to the input of the digital frequency divider 3 which gate is brought in the cut-off condition only when an output pulse of the shift register 12 appears. In order to adjust the program, the shift register 12 comprises an adjusting switch 15 having 11 positions for registering 0–10 pulses in the shift register 12, in which, by means of the adjusting switch, per 10 output pulses of the digital frequency divider 3, 0–10 output pulses are supplied by the shift register 12; for example, in the position 0 of the adjusting switch 15, the shift register supplies per 10 output pulses of the digital frequency divider 3 no output pulses, in the position 1 one output pulse, in the position 2 two output pulses, and so on.

The operation of the device described thus far will now be described in greater detail. Let it be assumed that the adjusting switch of the shift register 12 is set in position 1; in that case the shift register 12 supplies one output pulse (compare FIG. 2*c*) per 10 output pulses of the digital frequency divider 3, which output pulse is applied as a blocking pulse to the gate 14 arranged between the pulse generator 2 and the input of the digital frequency divider 3, as a result of which one pulse less is applied to the input of the digital frequency divider 3 than is supplied by the pulse generator 2. If the digital frequency divider 3 is set at the ratio of division of 475 in agreement with the embodiment described above, the digital frequency divider 3 will supply one output pulse each time after 475 input pulses and thus, when an output pulse of the register 12 appears there are 476 pulses of the pulse generator 2 required to generate 1 output pulse of the digital frequency divider 3 while in the absence of an output pulse of the shift register 12 only 475 pulses of the pulse generator 2 need appear for that purpose.

FIG. 2*d* shows the output pulses of the digital frequency divider 3 in which each time 9 out of 10 successive output pulses appear after 475 pulses of the pulse generator 2 and the tenth after 476 pulses, which latter pulse is denoted in the figure by P. Accordingly, the digital frequency divider 3 shows, over a period of time of 10 output pulses, 9 times a ratio of division of 475 and once a ratio of division of 476 corresponding to a total ratio division of $9 \times 475 + 1 \times 476{:}10 = 475.1$ with which, at the control frequency of 0.1 mc./s., a frequency of the oscillator 1 of $475.1 \times 0.1$ mc./s.=47.51 mc./s. corresponds.

If the adjusting switch 15 of the shift register 12 is switched to position 2, the total ratio of division becomes 475.2 and the oscillator frequency 47.52 mc./s., while in position 3 of the adjusting switch 15 the total ratio of division becomes 475.3 and the oscillator frequency 47.53 mc./s., and so on. By using the program pulse generator connected as a control circuit of the digital frequency divider 3 in the form of a shift register 12 with adjusting switch 15, it is thus effected that at the control frequency of 0.1 mc./s. the value of the frequency steps is brought from 0.1 mc./s. to 0.01 mc./s.

Whereas in the known device the oscillator frequency is stabilized by means of a periodic series of pulses located at mutually equal time distances (compare FIG. 2*a*) derived from the frequency divider 3, the stabilisation in the device according to the invention is effected by pulse patterns A consisting of 10 pulses in which in position 1 of the adjusting switch 15 of the shift register 12, each time the time spacing of the tenth pulse in a pulse pattern (pulse P in FIG. 2*d*) is increased—relative to the preceding pulse compared with the mutually equal time distances of the preceding pulses in the pulse pattern—over a time distance $\Delta T$ equal to the time distance between two successive pulses of the pulse generator 2, that is to say that the pulse P is modulated in position or in phase with a modulation index which is given by its relative time shift. In the embodiment described said modulation index is, for example, 1/475, since in fact the mutual time distance of the pulses in the pulse pattern A is equal to a series of 475 pulses of the pulse generator 2.

The indicated essential difference in operation of the device according to the invention relative to the known device causes the construction and proportioning of the AFC-circuit also to be different as will now be described in detail. In fact, if the periodic pulse patterns A in which, in the embodiment described, each time the tenth pulse P is phase-modulated, is applied for AFC-control to the phase discriminator 9, at phase discriminator 9 a very small ripple voltage will be superimposed upon the desired AFC control direct voltage by the phase demodulation in the phase discriminator 9, the frequency of which ripple voltage is equal to the recurrence frequency of the periodic pulse patterns A which in the embodiment described is 0.01 mc./s. and the amplitude of which is given by the modulation index of the pulse P of 1/475. In FIG. 2*e* the ripple voltage occurring is shown on an enlarged amplitude scale.

If, by the adjustment of the adjusting switch 15, several pulses in the periodic pulse patterns A are phase-modulated a ripple voltage of the shape shown in FIG. 2*e*, will be generated by each of the phase-modulated pulses in the periodic pulse series, so that the total ripple voltage is equal to the sum of the individual ripple voltages which show a mutual phase shift determined by the position of the phase-modulated pulses in the periodic pulse patterns. The shape and value of the total ripple voltage is determined by the position of the phase-modulated pulses in the periodic pulse patterns A; if, for example, in position 2 of the adjusting switch in addition to the enth pulse P also the fifth pulse Q (compare FIG. 2*f*) is phase-modulated, the ripple voltages denoted by the dotted-line curves *a*, *b* shown in FIG. 2*g* will be produced by said pulses P and Q from which the total ripple voltage results which is shown by the solid-line curve *c*, the amplitude of which, as may appear from the figure, is equal to the amplitude of the ripple voltage of FIG. 2*e* but the frequency of which has become twice the frequency of the periodic pulse patterns A and in the embodiment described thus is 0.02 mc./s.

In order to fulfil the interference suppression requirement of the AFC control voltage it should be ensured in the construction and proportioning of the AFC-circuit that said ripple voltage the level of which is already low can appear below the said interference level at the frequency corrector 11 coupled to the oscillator 1. If, for example, an interference level of less than 80 db is desired, an additional attenuation of only 27 db is necessary in the low-pass filter 10, corresponding to a limit frequency of 4.3 kc./s., with the oscillator 1 which is adjustable in steps of 0.01 mc./s. over the frequency range of 20–70 mc./s., as compared with the attenuation of the low-pass filter 10 of 80 db corresponding to the limit frequency of 1.1 kc./s. which is necessary to obtain the same interference level in the known device in which for frequency adjustment over the frequency range of 20–70 mc./s. likewise in steps of 0.01 mc./s. the ratio of division of the adjustable frequency divider is adjustable between 2000 and 7000 and the reference frequency is 0.01 mc./s. By using the measures according to the invention the limit frequency of the low-pass filter 10 can be decreased by a factor 4 in the same circumstances at the same interference level.

On the one hand it is achieved that the low-pass filter 10 can be consideterably less heavy and bulky and on the other hand the adjusting period is reduced by a factor 4 as a result of the higher limit frequency of the low-pass filter 10, while in addition the freedom in design is extended. Together with simplicity in construction, the device according to the invention provides a considerable extension of the application possibilities which makes the practical use considerably attractive.

Within the scope of the invention other constructions are possible; for example, in order to vary the ratio of division of the digital frequency divider 3, it is alternatively possible, instead of suppressing each time one pulse of the pulse generator 2 in the gate 4 by an output pulse of the shift register 12, to apply the output pulses of the shift register 12, through a combination device, as addivider 3, or to apply said output pulses of the shift register 12 as adjusting pulses to adjusting means of the digital frequency divider 3 for electronically varying its ratio of division.

Figure 3:
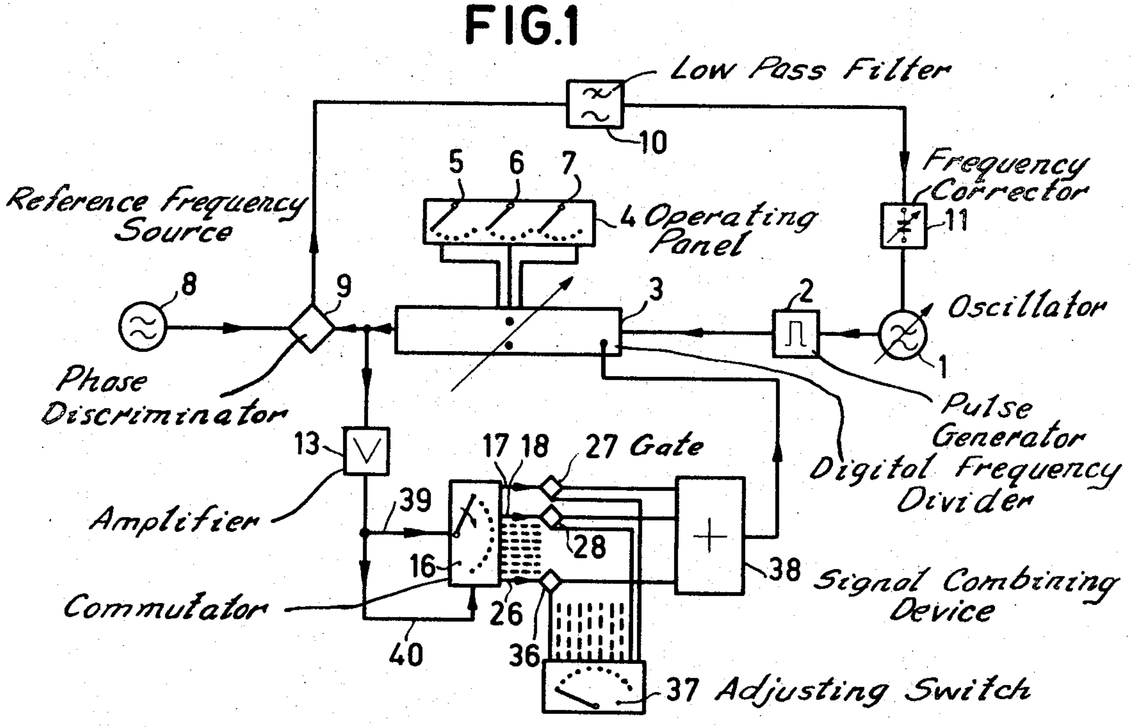
FIG. 3 shows a further embodiment of the device according to the invention.

The program pulse generator 12 may alternatively be constructed differently as will be explained with reference to FIG. 3. Elements corresponding to those denoted in FIG. 1 are designated by the same reference numerals.

In this device the output pulses of the digital frequency divider 3 are applied through the amplifier 13 and the line 39, to a program pulse generator which comprises a pulse commutator 16 which is synchronized, through line 40, by the output pulses of the digital frequency divider 3. In the pulse commutator 16 the output pulses of the digital frequency divider 3 are successively and periodically distributed between 10 parallel-arranged output lines 17, 18 . . . 26, that is to say that each time the first pulse of a pulse pattern consisting of 10 pulses is applied to the output line 17, the second pulse is applied to the output line 18, and so on. Such pulse commutators 16 are known in many variations from time multiplexing technology and therefore need not be further explained here.

A gate 27, 28 . . . 36 which is normally cut off is arranged in each of the said output lines 17–26 of the pulse commutator 16 and can be released by means of an adjusting switch 37 while the outputs of the gate 27–36 are connected, through a signal combining device 38, to adjusting means of the digital frequency divider 3. All the gates 27–36 are cut off in the position 0 of the adjusting switch 37 and no pulses are applied to the adjusting means of the digital frequency divider 3, in position 1 of the adjusting switch the gate 27 is released, and each time one pulse of a pulse pattern consisting of 10 pulses is applied to the adjusting means of the digital frequency divider 3, which pulse varies the ratio of division of the digital frequency divider by one, in position 2 of the adjusting switch 37 the gates 27, 28 are released and two pulses are applied to the adjusting means of the digital frequency divider 3, and so on.

Similar to the manner already explained with reference to FIG. 1, the oscillator 1 which is adjustable between 20–70 mc./s. and comprising a digital frequency divider 3 having a ratio of division between 200–700 is made adjustable in steps of 0.01 mc./s. by the program pulse generator described. Characteristic in all these constructions is always that a program pulse generator is connected to the output of the digital frequency divider 3, and is included as a control circuit in the circuit of the digital frequency divider 3 and varies the ratio of division of the digital frequency divider 3 each time an output pulse occurs.

What is claimed is:

1. A device employing a stepwise adjustable oscillator included in an AFC-circuit comprising an adjustable digital frequency divider connected to the output of the adjustable oscillator, said divider supplying at an output terminal a number of pulses corresponding to the divided oscillator frequency, a phase discriminator connected to said output terminal of said adjustable digital frequency divider, a source of reference frequency, means applying said reference frequency to said phase discriminator, means applying the output of said phase discriminator through a low-pass filter to a frequency corrector coupled in turn to the adjustable oscillator, a program pulse generator having a pre-set program to provide an output pulse in response to a predetermined number of input pulses applied thereto, means coupling said output terminal of said digital frequency divider to the input of said program pulse generator, and means responsive to the output of said program pulse generator to modify the effective number of input pulses applied to said divider to thereby vary the ratio of division of said divider each time an output pulse of the program pulse generator is applied thereto.

2. A device as claimed in claim 8, wherein said program pulse generator is constituted by a shift register having a number of shift register elements, means including the output pulses of the digital frequency divider for shifting the content of said register, an adjusting switch, said adjusting switch recording a number of pulses in the shift register elements in accordance with its adjusted position, said adjusting switch connected to the shift register elements.

3. A device as claimed in claim 1, wherein the program pulse generator is constituted by a pulse commutator which divides the output pulses of the digital frequency divider successively and periodically between a number of parallel-arranged output lines, and gating means being provided in said output lines which can be set from the cut-off condition to the released condition by means of an adjusting switch.

4. A device as claimed in claim 1, wherein a gate is provided between the input of the digital frequency divider and the oscillator and is controlled by the output pulses of the program pulse generator.

5. A device as claimed in claim 1 wherein the output of the program pulse generator is connected, through a signal combining device, to the input of the digital frequency divider.

6. A device as claimed in claim 1 wherein the output of the program pulse generator is connected to adjusting means of the digital frequency divider.

References Cited

UNITED STATES PATENTS 3,344,361 9/1967 Granqvist ---------- 331—18

ROY LAKE, Primary Examiner

S. H. GRIMM, Assistant Examiner

U.S. Cl. X.R.

331—25

PO-1050
(5/69)

UNITED STATES PATENT OFFICE
CERTIFICATE OF CORRECTION

Patent No. 3,516,007 Dated June 2, 1970

Inventor(s) MARINUS A. BOS, JOHANNES NOORDANUS, and GERARDUS ROSSER.

It is certified that error appears in the above-identified patent and that said Letters Patent are hereby corrected as shown below:

Column 3, line 22, cancel "control"

Column 5, line 23, "enth" should be --tenth--

Column 5, line 57, "consideterably" should be --considerably--

Column 5, between lines 71 and 72 insert the following:

--ditional pulses to the input of the digital frequency--

Claim 2, line 1, cancel "8" and insert --1--

Signed and sealed this 2nd day of May 1972.

(SEAL)
Attest:

EDWARD M.FLETCHER,JR.
Attesting Officer

ROBERT GOTTSCHALK
Commissioner of Patents